(12) United States Patent
Lin

(10) Patent No.: US 11,476,579 B2
(45) Date of Patent: Oct. 18, 2022

(54) WIDEBAND RF CHOKE

(71) Applicant: PCT International, Inc., Tempe, AZ (US)

(72) Inventor: Kang Lin, Chandler, AZ (US)

(73) Assignee: PCT International, Inc.

( * ) Notice: Subject to any disclaimer, the term of this patent is extended or adjusted under 35 U.S.C. 154(b) by 243 days.

(21) Appl. No.: 16/993,122

(22) Filed: Aug. 13, 2020

(65) Prior Publication Data
US 2022/0052453 A1 Feb. 17, 2022

(51) Int. Cl.
| H03F 1/32 | (2006.01) |
|---|---|
| H01Q 5/321 | (2015.01) |
| H01F 27/42 | (2006.01) |
| H03F 1/56 | (2006.01) |
| H03F 1/42 | (2006.01) |
| H03F 3/189 | (2006.01) |

(52) U.S. Cl.
CPC ............ *H01Q 5/321* (2015.01); *H01F 27/422* (2013.01); *H03F 1/42* (2013.01); *H03F 1/565* (2013.01); *H03F 3/189* (2013.01); *H03F 2200/36* (2013.01); *H03F 2200/451* (2013.01)

(58) Field of Classification Search
CPC ........................................................ H03F 1/32
USPC ................................................. 330/306, 151
See application file for complete search history.

(56) References Cited

U.S. PATENT DOCUMENTS

| 3,956,717 | A | 5/1976 | Fisher et al. |
|---|---|---|---|
| 5,481,757 | A | 1/1996 | Mihara et al. |
| 9,077,309 | B2 | 7/2015 | Dounaevski |
| 9,628,318 | B1* | 4/2017 | Gerdes ............... H04L 27/122 |
| 2005/0143026 | A1* | 6/2005 | Bellantoni ........... H04B 1/0458 |
|  |  |  | 455/121 |
| 2007/0063790 | A1 | 3/2007 | Strull et al. |
| 2013/0225099 | A1* | 8/2013 | Vosburgh ............ H04B 1/1018 |
|  |  |  | 455/306 |
| 2015/0263696 | A1 | 9/2015 | Dounaevski |

* cited by examiner

*Primary Examiner* — Henry Choe
(74) *Attorney, Agent, or Firm* — Thomas W. Galvani, P.C.; Thomas W. Galvani

(57) ABSTRACT

A wideband RF choke circuit includes an input, first and second nodes, and a splitting means coupled between the input, first node, and second node. A first all-pass filter and a first line AC blocker are coupled between the input and the splitting means. Second and third all-pass filters, and second and third line AC blockers, are coupled between the splitting means and the first and second nodes, respectively. A first RF choke has a first end, coupled to the first all-pass filter, and a second end. A second RF choke has a first end, coupled to the second end of the first RF choke, and a second end coupled to the second all-pass filter. A third RF choke has a first end, coupled to the second end of the first RF choke, and a second end coupled to the third all-pass filter.

6 Claims, 3 Drawing Sheets

WIDEBAND RF CHOKE

FIELD

The present specification relates generally to data communication, and more particularly to cable television network devices.

BACKGROUND

In cable television ("CATV") systems, audio, video, and data are distributed and collected through a coaxial cable network. With RF signals in the coaxial cables, that network transmits data both to and from subscribers in downstream and upstream directions. Alternating current ("AC") power, typically at 50 or 60 Hz, may also be passed through the coaxial cables. AC power is useful for powering trunk line amplifiers to increase the power of the RF signals in the network.

Power in the line can impact the RF transmission, however. There can be transmission and reflection losses in the RF frequency band of the network. An RF choke is sometimes useful for allowing passage of high AC (10-20 A, 50-60 Hz) with minimal impact on the RF transmission chain, especially the CATV RF transmission chain. Transmission and reflection losses should ideally be kept substantially constant across the working frequency band of the network, such that the transmission and reflection losses should have a substantially flat response curve.

CATV networks typically distribute RF signals in the legacy range of 5 MHz to 1 GHz. Conventional chokes used in these networks have reached fundamental limits. Decisions made to balance size and saturation characteristics cause resonance above 1.2 GHz. One current method for extending the frequency bandwidth of RF chokes includes using sophisticated copper windings on specially constructed ferrite cores with specific properties. This can extend the working frequency range up to 1.4 GHz when copper wire having a diameter of 1.5 millimeters is used. However, an improved RF choke is needed.

SUMMARY

In an embodiment, a wideband RF choke circuit includes an input, a first node, and a second node, and a splitting means coupled between the input, first node, and second node. A first all-pass filter and a first line AC blocker are coupled between the input and the splitting means. A second all-pass filter and a second line AC blocker are coupled between the splitting means and the first node. A third all-pass filter and a third line AC blocker are coupled between the splitting means and the second node. A first RF choke has a first end, coupled to the first all-pass filter, and a second end. A second RF choke has a first end, coupled to the second end of the first RF choke, and a second end coupled to the second all-pass filter. A third RF choke has a first end, coupled to the second end of the first RF choke, and a second end coupled to the third all-pass filter. In an embodiment, the splitting means is a directional coupler, the first node is an output, and the second node is a tap. In an embodiment, the splitting means is a splitter, the first node is a first output, and the second node is a second output. In an embodiment, a fuse assembly couples the first, second, and third choke circuits. In an embodiment, the fuse assembly includes: a first fuse having a first end, coupled to the second end of the first RF choke, and a second end; a second fuse having a first end, coupled to the second end of the first fuse, and a second end coupled to the first end of the second RF choke; and a third fuse having a first end, coupled to the second end of the first fuse, and a second end coupled to the first end of the third RF choke. In an embodiment, the circuit is configured to pass at least one of an RF signal and an AC signal omnidirectionally between at least two of the input, first node, and second node.

In another embodiment, a wideband RF choke circuit includes an input, a first output, a second output, and a third output, and first and second splitters coupled between the input, the first output, the second output, and the third output. A first all-pass filter and a first line AC blocker are coupled between the input and the first splitter. A second all-pass filter and a second line AC blocker are coupled between the first splitter and the first output. A third all-pass filter and a third line AC blocker are coupled between the splitting means and the second output. A fourth all-pass filter and a fourth line AC blocker are coupled between the splitting means and the third output. A first RF choke has a first end, coupled to the first all-pass filter, and a second end. A second RF choke has a first end, coupled to the second end of the first RF choke, and a second end coupled to the second all-pass filter. A third RF choke has a first end, coupled to the second end of the first RF choke, and a second end coupled to the third all-pass filter. A fourth RF choke has a first end, coupled to the second end of the first RF choke, and a second end coupled to the fourth all-pass filter. In an embodiment, a fuse assembly couples the first, second, third, and fourth choke circuits. In an embodiment, the fuse assembly includes: a first fuse having a first end, coupled to the second end of the first RF choke, and a second end; a second fuse having a first end, coupled to the second end of the first fuse, and a second end coupled to the first end of the second RF choke; a third fuse having a first end, coupled to the second end of the first fuse, and a second end coupled to the first end of the third RF choke; and a fourth fuse having a first end, coupled to the second end of the first fuse, and a second end coupled to the first end of the fourth RF choke. In an embodiment, the circuit is configured to pass at least one of an RF signal and an AC signal omnidirectionally between at least two of the input, first output, second output, and third output.

In another embodiment, a wideband RF choke circuit includes an input, an output, a first tap, and a second tap, and a splitting means coupled between the input, the output, and the first and second taps. A first all-pass filter and a first line AC blocker are coupled between the input and the splitting means. A second all pass filter and a first line AC blocker are coupled between the splitting means and the output. An RF choke is coupled between the first and second all-pass filters. A splitter is coupled to the splitting means at one end and coupled to the first and second taps at another end. In an embodiment, the splitting means is a directional coupler. In an embodiment, the splitting means is a splitter. In an embodiment, the first and second line AC blockers are each directly coupled to the splitting means, the first all-pass filter is directly coupled to the input, the second all-pass filter is directly coupled to the output. In an embodiment, the circuit is configured to pass at least one of an RF signal and an AC signal omnidirectionally between at least two of the input, output, first tap, and second tap.

The above provides the reader with a very brief summary of some embodiments described below. Simplifications and omissions are made, and the summary is not intended to limit or define in any way the disclosure. Rather, this brief summary merely introduces the reader to some aspects of some embodiments in preparation for the detailed description that follows.

BRIEF DESCRIPTION OF THE DRAWINGS

Referring to the drawings.

DETAILED DESCRIPTION

Figure 1:
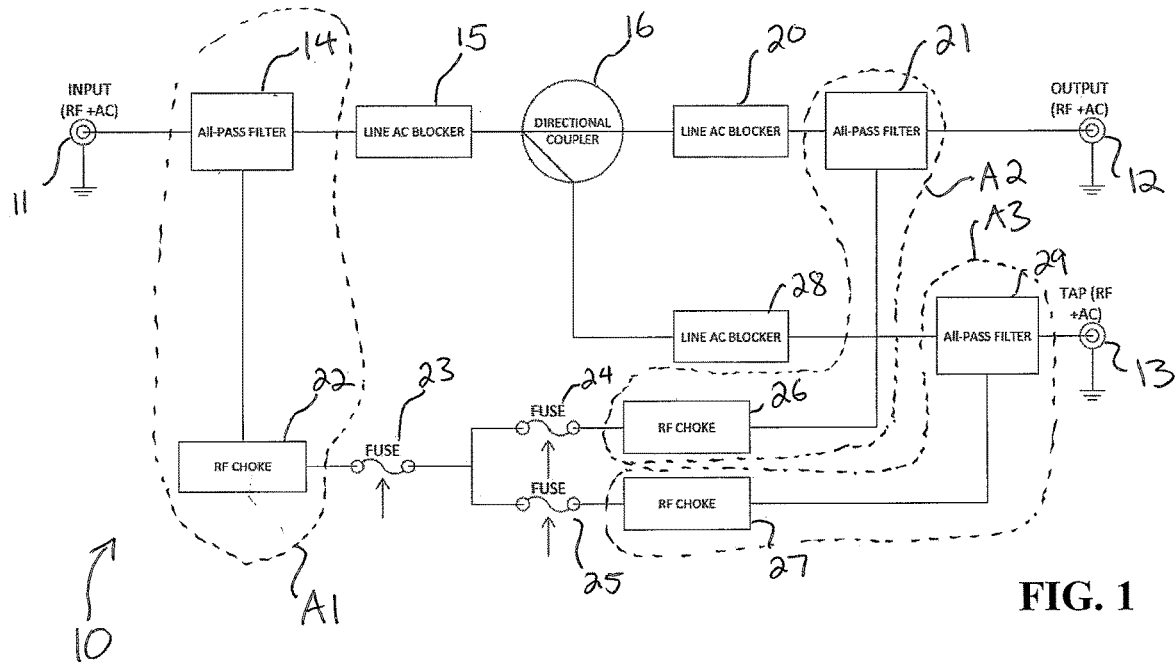
FIG. 1 is a functional block diagram of a circuit with RF chokes, all-pass filters, line AC blockers, and a directional coupler.

Reference now is made to the drawings, in which the same reference characters are used throughout the different figures to designate the same elements. The embodiments presented below and in the drawings are wideband, power-passing RF chokes. These chokes have operating frequencies extending beyond the legacy 5 MHz-1 GHz to an extended range of 5 MHz-3 GHz. These RF chokes use all-pass filters to eliminate the negative effects of resonant frequencies in order to create a substantially flat response curve for RF signals in that extended range.

FIG. 1 is a functional block diagram of a wideband RF choke circuit 10 (hereinafter "the circuit 10"). The circuit 10 includes an input 11, an output 12, and a tap 13, each of these being a node in the circuit 10. An all-pass filter 14 is coupled to the input 11. It is noted briefly here that the words "coupled" and "connected" may be used interchangeably herein and no distinction should be made between the use of one over the other. Further, coupled and connected can both mean directly or indirectly coupled and connected. A line AC blocker 15 is coupled to the all-pass filter 14, and a splitting means or directional coupler 16 is coupled to the line AC blocker 15. Another line AC blocker 20 is coupled to the directional coupler 16. Coupled to the line AC blocker 20 is another all-pass filter 21. The all-pass filter 21 is then coupled to the output 12.

The directional coupler 16 is also connected to another line AC blocker 28. The directional coupler 16 is arranged to transmit signals in both directions between the line AC blocker 15 and the line AC blockers 20 or 28. The line AC blocker 28 is coupled to an all-pass filter 29. The all-pass filter 29 is connected to the tap 13.

An RF choke 22 is coupled to the all-pass filter 14. A fuse 23 is connected to the RF choke 22. A first end of the fuse 23 is coupled to the RF choke, and a second end of the fuse 23 is coupled to two fuses 24 and 25. It is noted here that, as will be well understood by one having ordinary skill in the art, each element described in this specification has ends or leads, such as the first and second ends of the fuse 23, which couple or connect it to other elements. The ends or leads of the elements are not described or identified by reference character in the specification or drawings, because one having ordinary skill in the art will readily appreciate and understand the nature of the coupling from the description herein with contemporaneous reference to the corresponding drawing. As such, two fuses 24 and 25 are connected to the fuse 23. The fuses 23, 24, and 25 collectively define a fuse assembly. RF chokes 26 and 27 are connected to the fuses 24 and 25, respectively. The RF choke 26 is then connected to the all-pass filter 21, while the RF choke 27 is connected to the all-pass filter 29.

This circuit 10 has three choke circuits (the all-pass filter 14 and RF choke 22 define a first choke circuit A1, the all-pass filter 21 and the RF choke 26 define a second choke circuit A2, and the all-pass filter 29 and the RF choke 27 define a third choke circuit A3). The circuit 10 allows for signal transmission in ten manners, and is configured to pass at least one of an RF signal and an AC signal omnidirectionally between at least two of the input 11, output 12, and tap 13. A first RF signal (or "input-output RF signal") transmits an RF signal from the input 11, through the all-pass filter 14, line AC blocker 15, directional coupler 16, line AC blocker 20, all-pass filter 21, and finally to the output 12. Another RF signal transmits in an opposite direction to the input-output RF signal. A second RF signal (or "input-tap RF signal") transmits an RF signal from the input 11, through the all-pass filter 14, the line AC blocker 15, the directional coupler 16, the line AC blocker 28, the all-pass filter 29, and finally to the tap 13. Another RF signal transmits in an opposite direction to the input-tap RF signal. A first AC signal (or "input-output AC signal") transmits an AC signal from the input 11, through the all-pass filter 14, the RF choke 22, the fuse 23, the fuse 24, the RF choke 26, the all-pass filter 21, and finally to the output 12. Another AC signal transmits in an opposite direction to the input-output AC signal. A second AC signal (or "input-tap AC signal") transmits an AC signal from the input 11, through the all-pass filter 14, the RF choke 22, the fuse 23, the fuse 25, the RF choke 27, the all-pass filter 29, and finally to the tap 13. Another AC signal transmits in an opposite direction to the input-tap AC signal. Finally, a third AC signal (or "output-tap AC signal") transmits an AC signal from the output 12, through the all-pass filter 21, the RF choke 26, the fuse 24, the fuse 25, the RF choke 27, the all-pass filter 29, and finally to the tap 13. Another AC signal transmits in an opposite direction to the output-tap AC signal.

Figure 2:
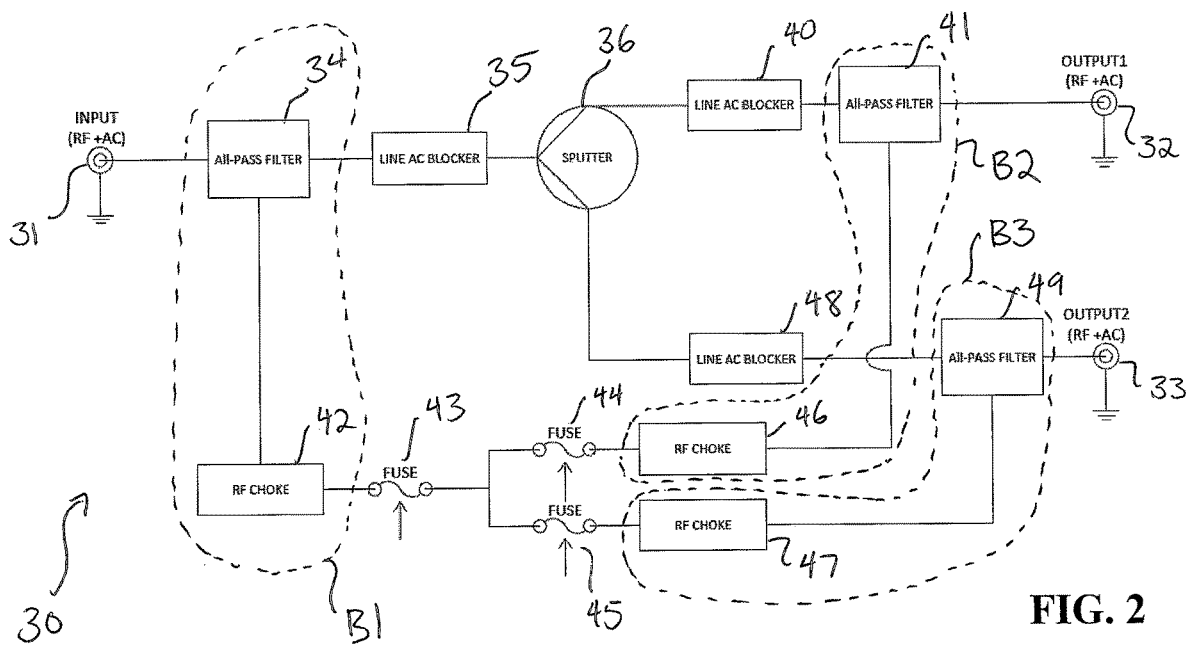
FIG. 2 is a functional block diagram of a circuit with RF chokes, all-pass filters, line AC blockers, and a splitter.

FIG. 2 is a functional block diagram of a wideband RF choke circuit 30 (hereinafter "the circuit 30"). The circuit 30 is similar to the circuit 10. It includes an input 31, a first output 32, and a second output 33, each of these being a node in the circuit 30. An all-pass filter 34 is coupled to the input 11. A line AC blocker 35 is coupled to the all-pass filter 34, and a splitting means or splitter 36 is coupled to the line AC blocker 35. Another line AC blocker 40 is coupled to the splitter 36. Coupled to the line AC blocker 40 is another all-pass filter 41. The all-pass filter 41 is then coupled to the first output 32.

The splitter 36 is also connected to another line AC blocker 48. The splitter 36 is arranged to transmit signal in both directions between the line AC blocker 35 and the line AC blockers 40 or 48. The line AC blocker 48 is coupled to an all-pass filter 49. The all-pass filter 49 is connected to the second output 33.

An RF choke 42 is also coupled to the all-pass filter 34. A fuse 43 is connected to the RF choke 42. Two fuses 44 and 45 are each connected to the fuse 43. The fuses 43, 44, and 45 collectively define a fuse assembly. RF chokes 46 and 47 are connected to the fuses 44 and 45, respectively. The RF choke 46 is then connected to the all-pass filter 41, while the RF choke 47 is connected to the all-pass filter 49.

This circuit 30 has three choke circuits: the all-pass filter 34 and the RF choke 42 defining a first choke circuit B1; the all-pass filter 41 and the RF choke 46 defining a second choke circuit B2; and the all-pass filter 49 and the RF choke 47 defining a third choke circuit B3. The circuit 30 allows for signal transmission in ten manners, and is configured to pass at least one of an RF signal and an AC signal omnidirectionally between at least two of the input 31, first output 32, and second output 33. A first RF signal (or "input-first output RF signal") transmits an RF signal from the input 31, through the all-pass filter 34, line AC blocker 35, splitter 36, line AC blocker 40, all-pass filter 41, and finally to the first output 32. Another RF signal transmits in an opposite direction to the input-first output RF signal. A second RF signal (or "input-second output RF signal") transmits an RF signal from the input 31, through the all-pass filter 34, the line AC blocker 35, the splitter 36, the line AC blocker 48, the all-pass filter 49, and finally to the second output 33. Another RF signal transmits in an opposite direction to the input-second output RF signal. A first AC signal (or "input-first output AC signal") transmits an AC signal from the input 31, through the all-pass filter 34, the RF choke 42, the fuse 43, the fuse 44, the RF choke 46, the all-pass filter 41, and finally to the first output 32. Another AC signal transmits in an opposite direction to the input-first output AC signal. A second AC signal (or "input-second output AC signal") transmits an AC signal from the input 31, through the all-pass filter 34, the RF choke 42, the fuse 43, the fuse 45, the RF choke 47, the all-pass filter 49, and finally to the second output 33. Another AC signal transmits in an opposite direction to the input-second output AC signal. A third AC signal (or "output-output AC signal") transmits an AC signal from the first output 32, through the all-pass filter 41, the RF choke 46, the fuse 44, the fuse 45, the RF choke 47, the all-pass filter 49, and finally to the second output 33. Another AC signal transmits in an opposite direction to the output-output AC signal.

Figure 3:
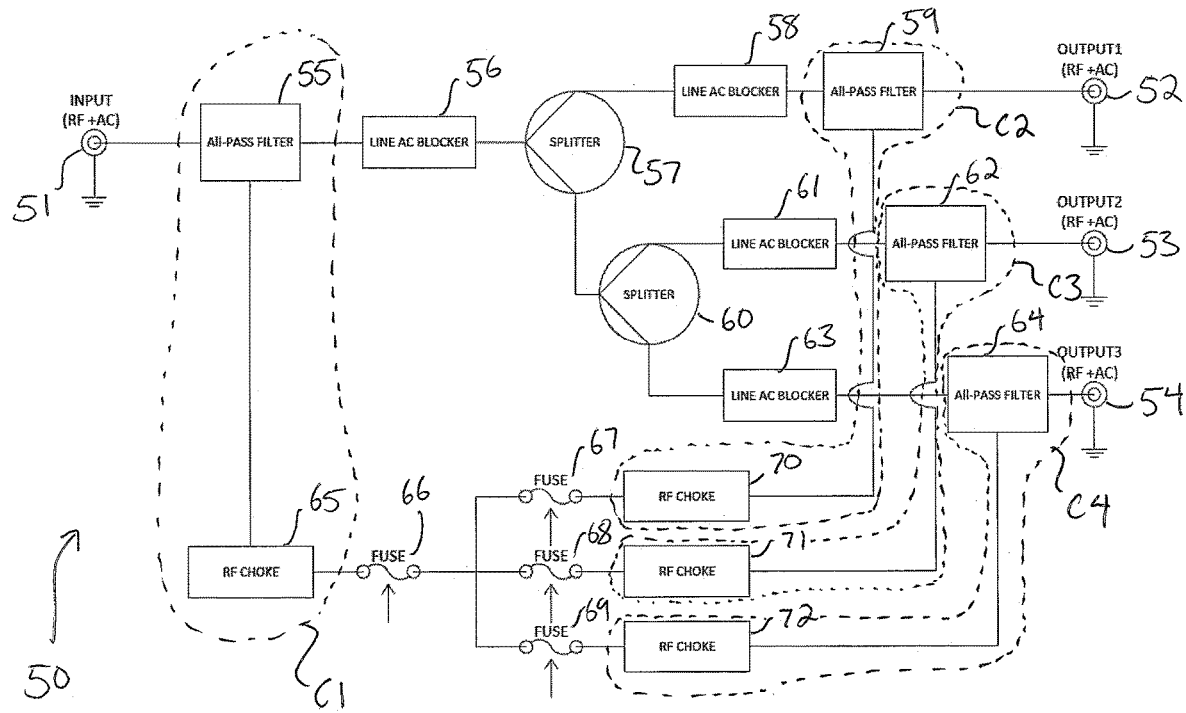
FIG. 3 is a functional block diagram of a circuit with RF chokes, all-pass filters, line AC blockers, and splitters.

FIG. 3 is a functional block diagram of a wideband RF choke circuit 50 (hereinafter "the circuit 50"). The circuit includes an input 51, a first output 52, a second output 53, and a third output 54, each of these being a node in the circuit 50. An all-pass filter 55 is coupled to the input 51. A line AC blocker 56 is coupled to the all-pass filter 55, and a splitting means or splitter 57 is coupled to the line AC blocker 56. Another line AC blocker 58 is coupled to the splitter 57. Coupled to the line AC blocker 58 is another all-pass filter 59. The all-pass filter 59 is then coupled to the first output 52.

Also coupled to the splitter 57 is another splitting means or splitter 60. That splitter 60, in turn, is coupled to two other line AC blockers 61 and 63. The splitter 57 is arranged to transmit signal in both directions between the line AC blocker 56 and the line AC blocker 58 or the splitter 60. Likewise, the splitter 60 is also arranged to transmit signal in both directions between the splitter 57 and the line AC blockers 61 or 63. An all-pass filter 62 is coupled to the line AC blocker 61 and also to the second output 53. Likewise, an all-pass filter 64 is coupled to the line AC blocker 63 and also to the third output 54.

An RF choke 65 is also connected to the all-pass filter 55. A fuse 66 is connected to the RF choke 65. Three fuses 67, 68, and 69 are connected to the fuse 66. The fuses 66, 67, 68, and 69 collectively define a fuse assembly. RF chokes 70, 71, and 72 are connected to the fuses 67, 68, and 69, respectively. The RF choke 70 is then connected to the all-pass filter 59, the RF choke 71 is connected to the all-pass filter 62, and the RF choke 72 is connected to the all-pass filter 64.

This circuit 50 has four RF choke circuits: the all-pass filter 55 and the RF choke 65 defining a first choke circuit C1; the all-pass filter 59 and RF choke 70 defining a second choke circuit C2; the all-pass filter 62 and RF choke 71 defining a third choke circuit C3; and the all-pass filter 64 and RF choke 72 defining a fourth choke circuit C4.

The circuit 50 allows for signal transmission in eighteen manners, and is configured to pass at least one of an RF signal and an AC signal omnidirectionally between at least two of the input 51, first output 52, and second output 53, and third output 54. A first RF signal (or "input-first output RF signal") transmits an RF signal from the input 51, through the all-pass filter 55, line AC blocker 56, splitter 57, line AC blocker 58, all-pass filter 59, and finally to the first output 52. Another RF signal transmits in an opposite direction to the input-first output RF signal.

A second RF signal (or "input-second output signal") transmits an RF signal from the input 51, through the all-pass filter 55, the line AC blocker 56, the splitter 57, the splitter 60, the line AC blocker 61, the all-pass filter 62, and finally to the second output 53. Another RF signal transmits in an opposite direction to the input-second output RF signal.

A third RF signal (or "input-third output signal") transmits an RF signal from the input 51, through the all-pass filter 55, the line AC blocker 56, the splitter 57, the splitter 60, the line AC blocker 63, the all-pass filter 64, and finally to the third output 54. Another RF signal transmits in an opposite direction to the input-third output RF signal.

A first AC signal (or "input-first output AC signal") transmits an AC signal from the input 51, through the all-pass filter 55, the RF choke 65, the fuse 66, the fuse 67, the RF choke 70, the all-pass filter 59, and finally to the first output 52. Another AC signal transmits in an opposite direction to the input-first output AC signal.

A second AC signal (or "input-second output AC signal") transmits an AC signal from the input 51, through the all-pass filter 55, the RF choke 65, the fuse 66, the fuse 68, the RF choke 71, the all-pass filter 62, and finally to the second output 53. Another AC signal transmits in an opposite direction to the input-second output AC signal.

A third AC signal (or "input-third output AC signal") transmits an AC signal from the input 51, through the all-pass filter 55, the RF choke 65, the fuse 66, the fuse 69, the RF choke 72, the all-pass filter 64, and finally to the third output 54. Another AC signal transmits in an opposite direction to the input-third output AC signal.

A fourth AC signal (or "first output-second output AC signal") transmits an AC signal from the first output 52, through the all-pass filter 59, the RF choke 70, the fuse 67, the fuse 68, the RF choke 71, the all-pass filter 62, and finally to the second output 53. Another AC signal transmits in an opposite direction to the first output-second output AC signal.

A fifth AC signal (or "first output-third output AC signal") transmits an AC signal from the first output 52, through the all-pass filter 59, the RF choke 70, the fuse 67, the fuse 69, the RF choke 72, the all-pass filter 64, and finally to the third output 54. Another AC signal transmits in an opposite direction to the first output-third output AC signal.

A sixth AC signal (or "second output-third output AC signal") transmits an AC signal from the second output 53, through the all-pass filter 62, the RF choke 71, the fuse 68, the fuse 69, the RF choke 72, the all-pass filter 64, and finally to the third output 54. Another AC signal transmits in an opposite direction to the second output-third output AC signal.

Figure 4:
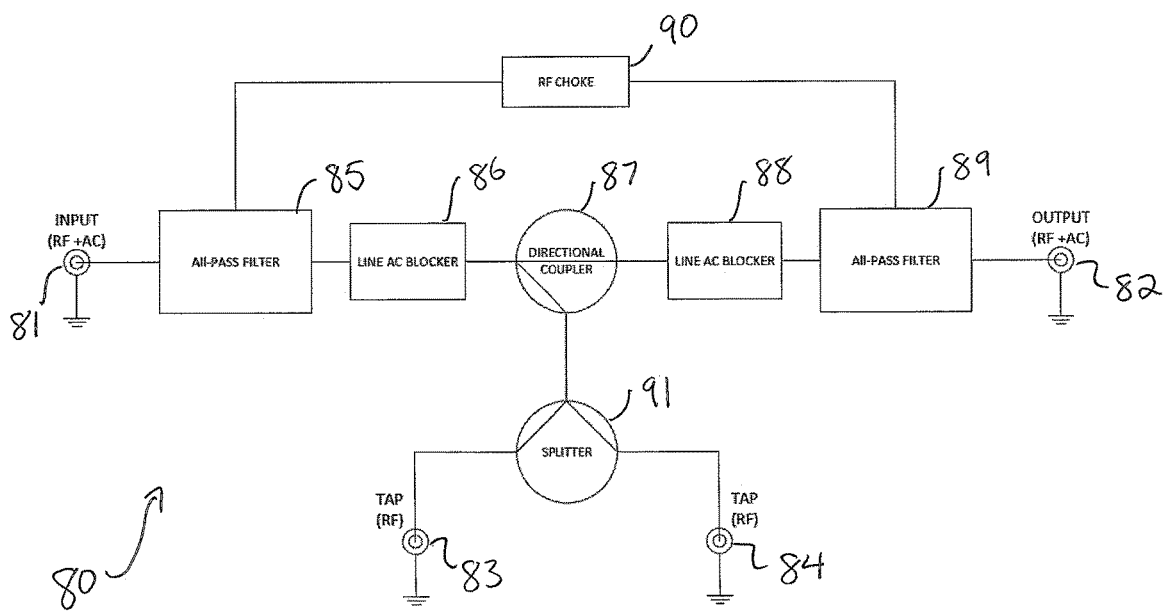
FIG. 4 is a functional block diagram of a circuit with RF chokes, all-pass filters, line AC blockers, a directional coupler and a splitter.

FIG. 4 is a functional block diagram of a wideband RF choke circuit 80 (hereinafter, the "circuit 80"). The circuit 80 includes an input 81, an output 82, and two taps 83 and 84, each of these being a node in the circuit 80. An all-pass filter 85 is coupled to the input 81. A line AC blocker 86 is coupled to the all-pass filter 85, and a splitter means or directional coupler 87 is coupled to the line AC blocker 86. Another line AC blocker 88 is coupled to the directional coupler 87. Coupled to the line AC blocker 88 is another all-pass filter 89. The all-pass filter 89 is then coupled to the first output 82. Coupled between the all-pass filters 85 and 89 is an RF choke 90. A splitting means or splitter 91 is also attached to the directional coupler 87. The splitter 91 is then coupled to each of the taps 83 and 84. The directional coupler 87 is arranged to transmit signal in both directions between the line AC blocker 86 and the line AC blocker 88 or the splitter 91, and the splitter 91 is also arranged to transmit signal in both directions between the directional coupler 87 and the taps 83 or 84.

The circuit 80 allows for signal transmission in six manners, and is configured to pass at least one of an RF signal and an AC signal omnidirectionally between at least two of the input 81, output 82, and taps 83 and 84. A first RF signal (or "input-output RF signal") transmits an RF signal from the input 81, through the all-pass filter 85, line AC blocker 86, directional coupler 87, line AC blocker 88, all-pass filter 89, and finally to the output 82. Another RF signal transmits in an opposite direction to the input-output RF signal. A second RF signal (or "input-tap RF signal") transmits an RF signal from the input 81, through the all-pass filter 85, line AC blocker 86, directional coupler 87, splitter 91, and then to either of the taps 83 and 84. Another RF signal transmits in an opposite direction to the input-tap RF signal. A first AC signal (or "input-output AC signal") transmits an AC signal from the input 81, through the all-pass filter 85, through the RF choke 90, through the all-pass filter 89, and finally to the output 82. Another AC signal transmits in an opposite direction to the input-output AC signal.

Figure 5:
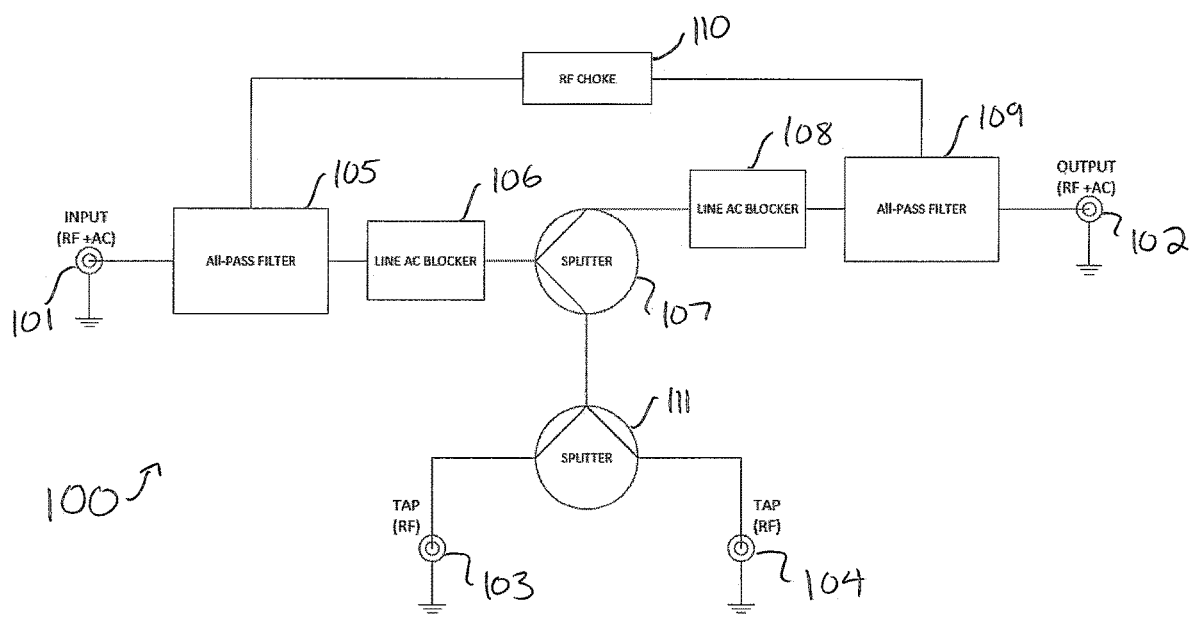
FIG. 5 is a functional block diagram of a circuit with RF chokes, all-pass filters, line AC blockers, and splitters.

FIG. 5 is a functional block diagram of a wideband RF choke circuit 100 (hereinafter, the "circuit 100"). The circuit 100 includes an input 101, an output 102, and two taps 103 and 104, each of these being a node in the circuit 100. An all-pass filter 105 is coupled to the input 101. A line AC blocker 106 is coupled to the all-pass filter 105, and a splitting means or splitter 107 is coupled to the line AC blocker 106. Another line AC blocker 108 is coupled to the splitter 107. Coupled to the line AC blocker 108 is another all-pass filter 109. The all-pass filter 109 is then coupled to the first output 102. Coupled between the all-pass filters 105 and 109 is an RF choke 110. Another splitting means or splitter 111 is coupled to the splitter 107. That other splitter 111 is then coupled to each of the taps 103 and 104. The splitter 107 is arranged to transmit signal in both directions between the line AC blocker 106 and the line AC blocker 108 or the splitter 111, and the splitter 111 is also arranged to transmit signal in both directions between the splitter 107 and the taps 103 or 104.

The circuit 100 allows for signal transmission in six manners, and is configured to pass at least one of an RF signal and an AC signal omnidirectionally between at least two of the input 101, output 102, and taps 103 and 104. A first RF signal (or "input-output RF signal") transmits an RF signal from the input 101, through the all-pass filter 105, line AC blocker 106, splitter 107, line AC blocker 108, all-pass filter 109, and finally to the output 102. Another RF signal transmits in an opposite direction to the input-output RF signal. A second RF signal (or "input-tap RF signal") transmits an RF signal from the input 101, through the all-pass filter 105, line AC blocker 106, splitter 107, splitter 111, and then to either of the taps 103 and 104. Another RF signal transmits in an opposite direction to the input-tap RF signal. A first AC signal (or "input-output AC signal") transmits an AC signal from the input 101, through the all-pass filter 105, through the RF choke 110, through the all-pass filter 109, and finally to the output 102. Another AC signal transmits in an opposite direction to the input-output AC signal.

A preferred embodiment is fully and clearly described above so as to enable one having skill in the art to understand, make, and use the same. Those skilled in the art will recognize that modifications may be made to the description above without departing from the spirit of the specification, and that some embodiments include only those elements and features described, or a subset thereof. To the extent that modifications do not depart from the spirit of the specification, they are intended to be included within the scope thereof.

What is claimed is:

1. A circuit comprising:
    an input, a first node, and a second node, and a splitting means coupled between the input, first node, and second node;
    a first all-pass filter and a first line AC blocker coupled between the input and the splitting means;
    a second all-pass filter and a second line AC blocker coupled between the splitting means and the first node;
    a third all-pass filter and a third line AC blocker coupled between the splitting means and the second node;
    a first RF choke having a first end, coupled to the first all-pass filter, and a second end;
    a second RF choke having a first end, coupled to the second end of the first RF choke, and a second end coupled to the second all-pass filter; and
    a third RF choke having a first end, coupled to the second end of the first RF choke, and a second end coupled to the third all-pass filter.

2. The circuit of claim 1, wherein the splitting means is a directional coupler, the first node is an output, and the second node is a tap.

3. The circuit of claim 1, wherein the splitting means is a splitter, the first node is a first output, and the second node is a second output.

4. The circuit of claim 1, further comprising a fuse assembly that couples the first, second, and third choke circuits.

5. The circuit of claim 4, wherein the fuse assembly includes:
    a first fuse having a first end, coupled to the second end of the first RF choke, and a second end;
    a second fuse having a first end, coupled to the second end of the first fuse, and a second end coupled to the first end of the second RF choke; and
    a third fuse having a first end, coupled to the second end of the first fuse, and a second end coupled to the first end of the third RF choke.

6. The circuit of claim 1, wherein the circuit is configured to pass at least one of an RF signal and an AC signal omnidirectionally between at least two of the input, first node, and second node.

* * * * *